United States Patent
Grodzki

(10) Patent No.: US 11,474,177 B2
(45) Date of Patent: Oct. 18, 2022

(54) METHOD FOR MAGNETIC RESONANCE IMAGING AND MAGNETIC RESONANCE DEVICE

(71) Applicant: Siemens Healthcare GmbH, Erlangen (DE)

(72) Inventor: David Grodzki, Erlangen (DE)

(73) Assignee: Siemens Healtchare GmbH, Erlangen (DE)

( * ) Notice: Subject to any disclaimer, the term of this patent is extended or adjusted under 35 U.S.C. 154(b) by 0 days.

(21) Appl. No.: 17/148,964

(22) Filed: Jan. 14, 2021

(65) Prior Publication Data

US 2021/0215780 A1  Jul. 15, 2021

(30) Foreign Application Priority Data

Jan. 14, 2020 (DE) .................. 102020200389.0

(51) Int. Cl.
| | | |
|---|---|---|
| *G01R 33/48* | (2006.01) | |
| *G01R 33/561* | (2006.01) | |
| *G01R 33/54* | (2006.01) | |

(52) U.S. Cl.
CPC ..... *G01R 33/4822* (2013.01); *G01R 33/4816* (2013.01); *G01R 33/543* (2013.01); *G01R 33/5618* (2013.01)

(58) Field of Classification Search
CPC ............ G01R 33/4822; G01R 33/4816; G01R 33/543; G01R 33/5618; G01R 33/56
See application file for complete search history.

(56) References Cited

U.S. PATENT DOCUMENTS

| | | | |
|---|---|---|---|
| 2003/0206015 A1* | 11/2003 | Feiweier | G01R 33/3854 324/309 |
| 2018/0238985 A1* | 8/2018 | Grodzki | G01R 33/546 |
| 2020/0363484 A1 | 11/2020 | Froidevaux et al. | |

FOREIGN PATENT DOCUMENTS

| | | | | |
|---|---|---|---|---|
| EP | 2933651 A1 * | 10/2015 | ......... | G01R 33/5613 |
| WO | 2019072778 A1 | 4/2019 | | |

OTHER PUBLICATIONS

Weiger, Markus et al.: "Short-T2 MRI: Principles and recent advances" Progress in nuclear magnetic resonance spectroscopy 114-115, pp. 237-270; 2019.

(Continued)

*Primary Examiner* — Susan S Lee
(74) *Attorney, Agent, or Firm* — Banner & Witcoff Ltd.

(57) ABSTRACT

In a method for MRI where k-space describing spatial frequencies in an acquisition volume (AV) is scanned, a first measured data acquisition is performed in the AV with a first gradient field strength of a gradient field, including irradiating a RF pulse into the AV and acquiring a first series of measured values spaced apart temporally, a second measured data acquisition is performed with a second, different gradient field strength, including irradiating a RF pulse into the AV and acquiring a second series of measured values spaced apart temporally. With the first measured data acquisition, the first measured values for a respective response signal are acquired at a first time interval from one another and with the second measured data acquisition, the second measured values for a respective response signal are acquired at a second, different time interval from one another.

11 Claims, 3 Drawing Sheets

(56) References Cited

OTHER PUBLICATIONS

David M. Grodzki et al; "Ultrashort echo time imaging using pointwise encoding time reduction with radial acquisition (PETRA)"; Magn. Reson. Med. 67: 510-518; 2012.
German Office Action dated Nov. 24, 2020, Application No. 10 2020 200 389.0.

* cited by examiner

METHOD FOR MAGNETIC RESONANCE IMAGING AND MAGNETIC RESONANCE DEVICE

CROSS REFERENCE TO RELATED APPLICATIONS

This patent application claims priority to German Patent Application No. 10 2020 200 389.0, filed Jan. 14, 2020, which is incorporated herein by reference in its entirety.

BACKGROUND

Field

The disclosure relates to a method for magnetic resonance imaging by means of a magnetic resonance (MR) device.

Related Art

In some magnetic resonance imaging (MRI) applications, in particular in the context of medical imaging, it is expedient to use sequences with ultrashort echo times of less than 100 ms, for instance. In this regard, a non-selective excitation is typically used and the measurement takes place in what is known as the "free induction decay". Two different types of measuring sequences are typically used here. With a first type, to which the "ultrashort echo time" (UTE) sequences belong, the gradients for phase encoding are only started up after excitation by a radio frequency pulse. This can result in delays in the gradient circuit and/or eddy currents during the gradient ramp negatively affecting the measurement, however.

With other sequences with ultrashort echo times, the gradient field is already set before irradiating the excitation pulse. In this way the afore-cited problems can be avoided and a noise exposure, for instance for a patient in the acquisition volume, can be significantly reduced. Examples of such sequences are the "zero echo time" (zTE) sequence, the "water and fat suppressed proton projection MRI" (WASPI) sequence and the "pointwise encoding time reduction with radial acquisition" (PETRA) sequence. With all three sequences, a continuously increasing phase encoding takes place by means of the switched gradients, as a result of which after one single excitation pulse temporally consecutive response signals can be scanned for a number of points in the k-space which are spaced apart in the gradient field direction. The scanning of the k-space therefore takes place along radial spokes.

The disadvantage here, however, is firstly that a minimum time is required to switch over between a transmit and a receive operation, so that with these acquisitions it is initially not possible to acquire the center of the k-space. With the zTE sequence, an attempt is made to calculate the unacquired points by interpolation. The WASPI sequence uses an additional measured data acquisition with a lower gradient field strength so that the non-scanned area can be reduced. With the PETRA sequence, the initially unacquired points in the center of the k-space are measured by single point methods. Further information relating to such sequences with ultrashort echo times can be taken, for instance, from the publication by D. M Grotzki et al., "Ultrashort Echo Time Imaging Using Pointwise Encoding Time Reduction With Radial Acquisition (PETRA)", Magnetic Resonance in Medicine 67: 510-518 (2012)".

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
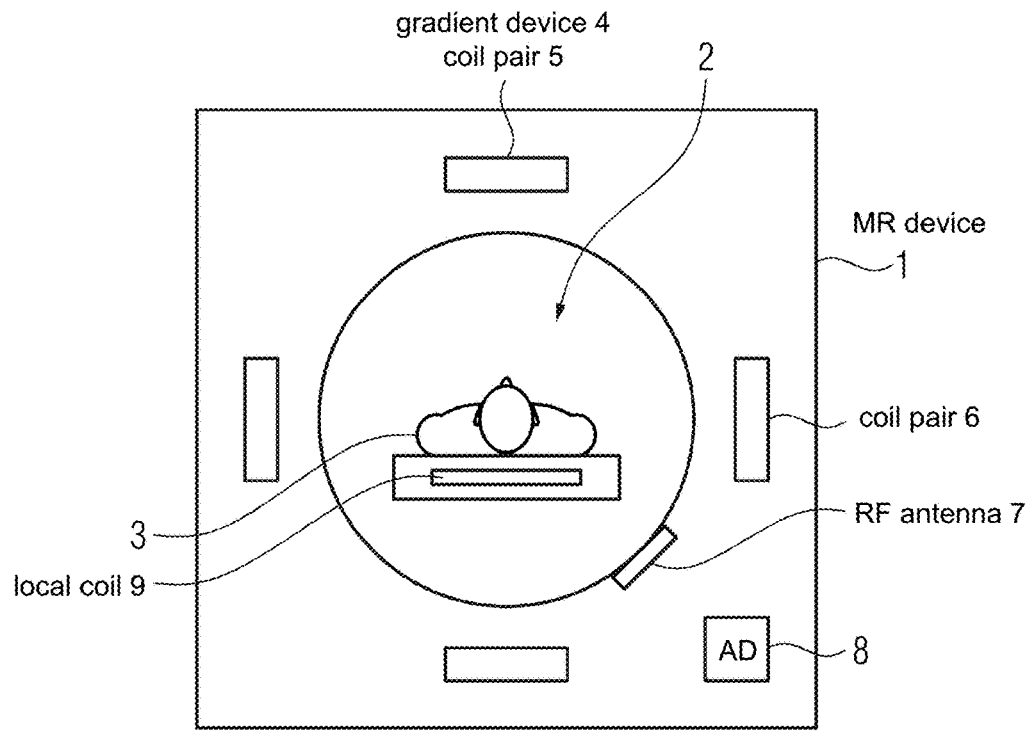
FIG. 1 shows a magnetic resonance device according to an exemplary embodiment.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

With the magnetic resonance imaging, in particular in the medical field, it can be highly relevant to achieve as good an image quality as possible, for instance in order to enable a robust diagnosis based on the image data. It is essential here to achieve as good a signal-to-noise ratio as possible. An object of the disclosure is to specify a method for magnetic resonance imaging, which, compared with the prior art, can achieve an improved image quality, in particular an improved signal-to-noise ratio.

In an exemplary aspect, in the first measured data acquisition, the measured values for the respective response signal are acquired at a first time interval from one another, and with the second measured data acquisition, the measured values for the respective response signal are acquired at a second time interval from one another which differs from the first time interval.

For example, in one or more aspects, a k-space describing spatial frequencies in an acquisition volume is scanned, by at least one first measured data acquisition with a first gradient field strength of a gradient field taking place in the acquisition volume and a second measured data acquisition with a second gradient field strength of the gradient field which differs from the first gradient field strength taking place. In the context of the first and second measured data acquisition, at least one radio frequency pulse is irradiated in each case into the acquisition volume and a respective sequence of temporally spaced measured values is acquired for at least one coordinate of k-space by an acquisition device, said measured values describing a respective received and in particular frequency-converted response signal.

The time intervals at which the measured values or samples for a response signal are acquired are also referred to as dwell time in the field of magnetic resonance tomography. It is known here that in order to correctly acquire response signals with a high bandwidth, relatively short time intervals between the measured values or short read-out times for the individual measured values are required, since these time intervals are inversely proportional to the read-out bandwidth. With the afore-described sequences with an ultrashort echo time, in which a radial scanning of the k-space takes place, in other words in particular with the PETRA or WASPI sequence, the gradient field is switched while the response signal is read out so that in this way the received response signal is frequency-encoded, in other words partial signals of the response signal from different positions along the gradient field direction have different frequencies. This results in the bandwidth of the response signal scaling with the gradient field strength of the gradient field.

In the methods according to exemplar aspects, within the scope of the radial scanning of the outer area of the k-space, relatively large gradient field strengths are used in order, on the one hand, to achieve a rapid scanning of the k-space and, on the other hand, to suppress specific negative effects, for instance the effects of a chemical frequency shift. To robustly reproduce the response signals, relatively short time intervals of the measured value acquisitions of for instance 20 ns are therefore necessary, as a result of which a large bandwidth and thus a relatively large noise portion results.

In aspects of the disclosure, it was identified that in cases in which two measured data acquisitions with different gradient field strengths take place for scanning the k-space, different time intervals between the acquisitions of the measured values of the respective response signal can also be used herefor. For instance, in the WASPI or PETRA sequence significantly lower gradient field strengths are used for scanning the surrounding area of the k-space center than for scanning the outer area. For instance, this enables larger time intervals between the acquisitions of the measured values to be used to scan the inner area, as a result of which the bandwidth and thus the noise can be reduced.

Since in magnetic resonance imaging devices main magnets with a substantially homogenous magnetic field strength are typically used in the acquisition volume of more than 1 T, the directly received response signal is firstly very high-frequency. Typically a digitization or scanning of the response signal to determine the measured values therefore does not take place directly, but this only takes place after a frequency conversion.

In this regard, the variable time interval between the acquisitions of the measured values of a response signal can result directly from a different digitization, for instance by a lower sample rate being used, in particular in conjunction with an antialiasing filter attuned hereto. Alternatively, measured values for the respective response signal can be generated with larger time intervals, for instance in that an acquisition of preliminary measured values with shorter time intervals firstly takes place, whereupon a resampling of the measured values takes place at larger time intervals, in particular in conjunction with a filtering or other limitations of the signal bandwidth.

As already mentioned, with WASPI sequence typically precisely two gradient field strengths, namely a higher gradient field strength and a lower gradient field strength, are used to scan the outer k-space area and the k-space area close to the center in each instance. Therefore with such a sequence, the scanning of the outer k-space area can be implemented as the first measured data acquisition and the scanning of the inner k-space area can be implemented as the second measured data acquisition.

With a PETRA sequence, the scanning of the inner area of the k-space takes place in Cartesian coordinates, in particular as single point scanning. Fixed echo times are typically used here, so that the different intervals of the scanned points from the k-space center are set by predetermining gradient fields of different strengths. The same gradient field strength can therefore be used in particular for all points in the outer area of the k-space, and different gradient field strengths can be used for the points in the inner area of the k-space, depending on the distance from the k-space center. The same time interval between measured value acquisitions can also always be used in the outside space since the same gradient field strength is always used. In the interior, in an exemplary embodiment, another time interval is used for the measured value acquisition, wherein it is herewith possible, on the one hand, for the same time interval to be used for all coordinates in the inner area of the k-space, or for different time intervals also to be used there for different gradient field strengths.

The acquisition time for acquiring the response signal is the product of the number of measured values, which are acquired in order to reproduce the response signal, and their time interval. In some cases, for instance if the response signal described by the measured values is to be further processed by a Fast Fourier transformation, it may be advantageous always to use the same number of measured values to reproduce the response signal. This results in the acquisition time for the response signal scaling with the time intervals used. This can limit the maximum length of the time interval, since, within the scope of the time intervals predetermined by the sequence for the measurement associated with the respective individual excitations, aside from the acquisition time, sufficient time must also remain for the excitation by the radio frequency pulse, the setting of the gradient field, etc. While a bandwidth of substantially zero is therefore sufficient, for instance, for the reproduction of the k-space center by means of a single point acquisition and thus in principle approximately endlessly long time intervals could be used, these are limited by other factors.

Alternatively, it would also be possible to acquire a different number of measuring points for response signals which are acquired under different gradient field strengths. It would even be possible, for instance, to use the same acquisition time for response signals, the measured values of which are acquired with different time intervals. However, a different number of measured values results here for the different response signals, which can hamper the further signal processing.

In an exemplary embodiment, the magnetic resonance device includes a main magnet for generating a main magnetic field and a gradient device for generating a gradient field overlying the main magnetic field in the acquisition volume. The respective radio frequency pulse can be irradiated into the acquisition volume by a radio frequency device of the magnetic resonance device. The gradient device can provide three orthogonal gradient sub fields, for instance, which can be provided by coil pairs, for instance. By overlying these three gradient sub fields with different amplitudes, the gradient field direction and the gradient field strength of the gradient field can be predetermined substantially freely.

The imaging is typically carried out in the position space. To this end, a spin density distribution can firstly be determined in the k-space on the basis of the measured values, and these are transferred into the position space by means of Fourier transformation, for instance. If the k-space is scanned at least partially in the radial direction, it may be advantageous firstly to scan around the spin density distribution in the k-space in order to obtain a spin density distribution in the Cartesian coordinates in the k-space, which enables the use of Fast Fourier transformation, for instance. The acquisition and processing of image data in the context of magnetic resonance imaging is in principle well-known in the prior art and should therefore not be explained in detail.

In the method according to an exemplary embodiment, the first gradient field strength is larger than the second gradient field strength, wherein the first time interval is smaller than the second time interval. As mentioned above, with a use of a smaller gradient, the required bandwidth is lower which makes a larger time interval between the measured values possible.

The time interval can be inversely proportional to the gradient field strength at least for the first and second measured data acquisition. For instance, with the PETRA sequence in the k-space center, a single point method is used, in which the scanned coordinate, irrespective of a prefactor, can be specified as the product of the field strength vector of the gradient field and the echo time. With a fixed echo time, the gradient field strength is therefore proportional to the distance between the coordinate of the k-space to be scanned and the k-space center. The time interval between the acquisitions of the measured values of the response signal for a specific coordinate of the k-space can therefore be inversely proportional to the distance between this coordinate and the center of the k-space. In this regard, it is possible to deviate from this context in particular for at least one third measured data acquisition. This may be expedient, for instance, since the cited connection in the k-space center, as explained above, would predetermine endless time intervals between the acquisitions of the measured values, which is obviously not expedient.

The measured data acquisition can be carried out for more than two gradient field strengths which differ from one another, wherein the time intervals between the acquisition of the measured values are selected so that the product of the respective gradient field strength and the time interval for all measured data acquisitions or for all measured data acquisitions, the gradient field strength of which exceeds a predetermined limit value, is constant and/or wherein the same time intervals are used for all measured data acquisitions, the gradient field strength of which does not reach a predetermined limit value. In this regard, optimal time intervals can be selected, for instance, in the PETRA sequence at least for a majority of the coordinates for which a single point acquisition takes place, wherein a constant time interval can be selected for the center of the k-space or in the immediate surrounding area to ensure that the overall acquisition time for the response signal is not excessively long.

In an exemplary embodiment of the disclosure, coordinates of the k-space are exclusively scanned by means of the first measured data acquisition, the distance of which from the center of the k-space exceeds a predetermined limit value and/or coordinates of the k-space are exclusively scanned by the second measured data acquisition, the distance of which from the center of the k-space does not reach the limit value. The first measured data acquisition can therefore be used to acquire the outer area of the k-space, for instance in the WASPI or PETRA sequence explained above. The second measured data acquisition can be used to acquire the center of the k-space or the area surrounding the center. In this regard, a number of different measured data acquisitions with different gradient field strengths can also be used in the inner area of the k-space, as was explained above.

Within the context of the reconstruction of image data, the measured values determined for a respective coordinate in the k-space or a spin density determined from these measured values in the k-space can be weighted as a function of the time interval between the acquisitions of the measured values. As was already explained, a longer time interval of the measured value acquisition results in a lower noise. In order to avoid an overweighting of the k-space center on account of the improved signal-to-noise ratio there, it may be advantageous to carry out a scaling as a function of the time interval used. If a time interval $T_0$ is used to acquire the outer area of the k-space, for instance, and the measured values or spin densities acquired there are scaled with the factor 1, then for other measured values or spin densities the root from the ratio of the time interval $T_0$ and a time interval T can be used for the measured values of the respective coordinate. If, for instance, a time interval which is twice as long is used, an improvement in the signal-to-noise ratio by the factor $\sqrt{2}$, in other words by approx. 40%, results herefrom. Measured values or the spin density for a coordinate with correspondingly improved signal-to-noise ratio can therefore be scaled by the factor 1:1.4.

With the first and/or second measured data acquisition, the radio frequency pulse can be irradiated into the acquisition volume since a respective predetermined gradient field is set. Alternatively or in addition, measured values for different coordinates of the k-space can be acquired after irradiating the radio frequency pulse in consecutive time intervals in each case. As mentioned above, the inventive method can be used in particular in the context of PETRA or WASPI sequences which have corresponding properties.

In addition to the method according to the disclosure, the disclosure relates to a magnetic resonance device with a gradient device for generating a gradient field in an acquisition volume, a radio frequency device for irradiating a radio frequency pulse into the acquisition volume and an acquisition device, wherein the acquisition device is set up to acquire response signals and to control the gradient device and the radio frequency device in accordance with the inventive method.

The basic design of magnetic resonance devices is well-known in the prior art and should not be explained in more detail. Features and details which were explained in relation to the inventive method can be transferred with the cited advantages to the inventive magnetic resonance device, and vice versa.

Moreover, the disclosure relates to a computer program for an acquisition device of a magnetic resonance device with program instructions, which carry out the inventive method when carried out on the acquisition device. Components of the magnetic resonance device which are relevant hereto were already explained above.

Moreover, the disclosure relates to a computer-readable data carrier, which comprises an inventive computer program.

FIG. 1 shows a magnetic resonance device 1 for imaging on an examination object 3, for instance a patient, which is received in an acquisition volume 2. A main magnet, not shown, generates a relatively homogenous strong main magnetic field, which can have a strength of several Tesla, for instance. Three orthogonal partial gradient fields can be provided by a gradient device 4, of which only two coil pairs 5, 6 are shown, by means of the overlaying of which a gradient field with a predetermined gradient field direction and gradient field strength can thus be predetermined. A defined inhomogeneity of the magnetic field in the acquisition volume 2 can be achieved by using the gradient field, as a result of which Larmor frequencies of nuclear spins in the acquisition volume 2 are position-dependent.

Measuring sequences are primarily discussed below, in which firstly the gradient field is predetermined, whereby a radio frequency pulse is irradiated into the acquisition volume 2 by way of a radio frequency (RF) device 7, for instance a radio frequency antenna. The gradient device 4, coil pairs 5, 6, and RF device 7 can collectively be referred to as a scanner. The scanner can include further components (e.g. main magnet, etc.) as would be understood by one of ordinary skill in the art.

A resulting response signal is then acquired by means of the acquisition device 8, for instance by way of a local coil 9. The acquisition is carried out in particular in that the response signal is converted into a base band and is then digitized by measured values being acquired at fixed time intervals. Here, the fact that different gradient field strengths are used in PETRA or WASPI measuring sequences to scan different areas of the k-space is exploited, which, as was already described in detail in the general part of the description, also allows different scanning rates or time intervals between the individual measured values to be used for the respective response signal. In an exemplary embodiment, the acquisition device 8 includes processor circuitry that is configured to perform one or more functions and/or operations of the acquisition device 8. In an exemplary embodiment, the acquisition device further includes a memory. The acquisition device 8 can be referred to as a controller. The measuring method carried out by the acquisition device 8 is explained in more detail below with respect to the flow chart shown in FIG. 2.

Figure 4:
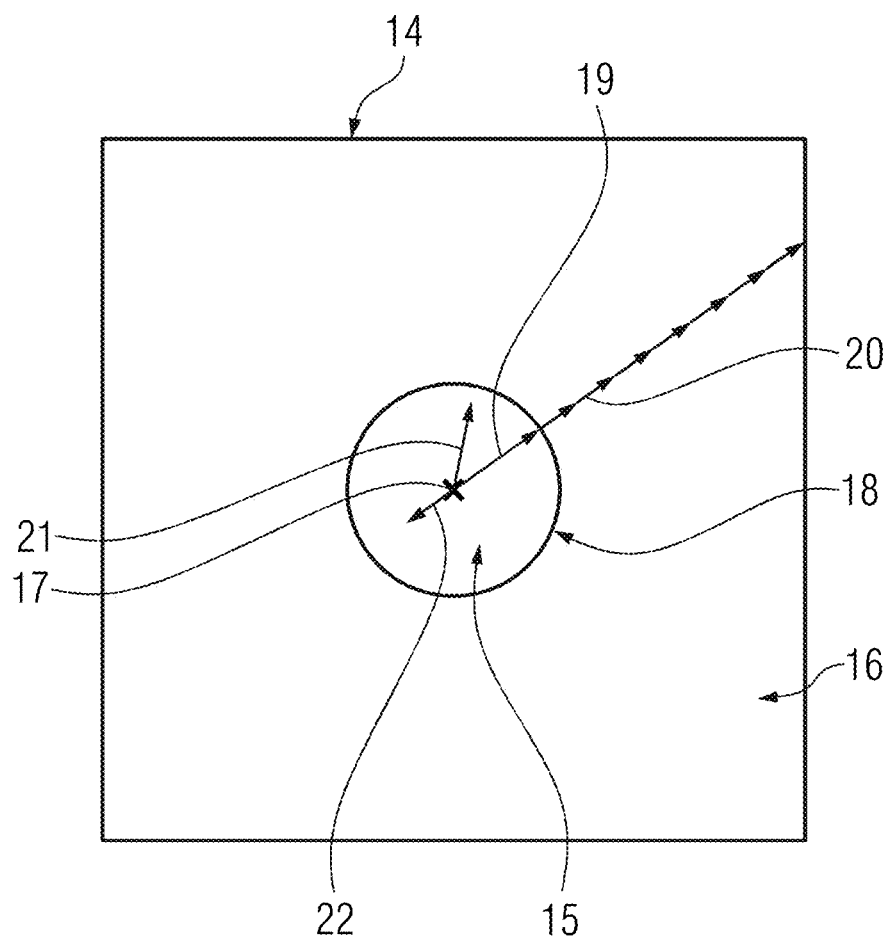
FIG. 4 illustrates example scans of k-space of the methods illustrated in FIGS. 2 and 3.

In step S1, a first measured data acquisition initially takes place, within which in particular coordinates of a k-space 14 shown in FIG. 4 are scanned, the distance of which from the center 17 of the k-space exceeds a predetermined limit value 18, and which therefore lie in an outer area 16 of the k-space 14.

The k-space reproduces spatial frequencies of the spin density distribution in the acquisition volume 2, and is shown two-dimensionally in FIG. 4 for reasons of clarity, although in particular with sequences with ultrashort echo times, a non-selective excitation typically takes place, and the acquisition of measured data therefore typically takes place in a three-dimensional k-space. A specific coordinate in the k-space 15 specifies the amplitude with which each spatial frequency occurs in which direction. Spatial frequencies are acquired in the context of the magnetic resonance imaging as a result of a phase encoding taking place by applying the gradient field, wherein the product of gradient field strength and the time for which the gradient field is applied specifies how significantly the phase of the excited nuclear spins in the direction of the gradient field varies and therefore how high spatial frequencies are reproduced. If a gradient field is applied in the direction of the arrow 19 in FIG. 4, for instance, the coordinate therefore roams with increased time in the direction of the arrow 19.

The product of a dead time, during which no data acquisition is possible after irradiating the radio frequency pulse, and the gradient field strength therefore specifies the smallest distance from the center 17 in the k-space in which a data acquisition can take place and thus for instance the limit value 18. If a respective response signal is now acquired at regular time intervals starting from this point in time, the coordinate for which this response signal is acquired therefore roams, as shown in FIG. 4 by the shorter arrows 20, in the direction in which the gradient field is applied. If with the same gradient field strength this acquisition is repeated for different gradient field directions, a spoke-type radial scanning of the outer area 16 of the k-space takes place, as used for instance in the WASPI or PETRA sequences already mentioned.

In order to achieve an adequately rapid scanning of the outer area 16, relatively large gradient field strengths 10 are preferably used here. A large bandwidth of the response signal results herefrom, as already mentioned, whereby the measured values for robust reproduction of the response signal are to be acquired with a relatively small first time interval 12.

In step S2, a second measured data acquisition takes place with a second gradient field strength 11 which differs from the first gradient field strength 10. In this regard, the second measured data acquisition, irrespective of the lower gradient field strength 11, can take place similarly to the first measured data acquisition, as a result of which it is possible also to scan coordinates closer to the center 17 of the k-space 14. Such a procedure is used in the WASPI sequence known per se.

Instead, it is also possible to acquire coordinates in the inner area 15 of the k-space by means of a single point acquisition. In this regard, a distance and a direction of the distance is determined in each case for the respective coordinate to be acquired. The direction of the distance corresponds to the direction of the gradient field to be used. Since with the single point acquisition constant echo times, in other words distances from the irradiation of the radio frequency pulse as far as the measured data acquisition, are typically to be used, the gradient field strength 11 used is selected as a function of the distance of the coordinate from the center 17. Corresponding movements in the k-space through such gradient fields are shown by way of example in FIG. 4 by the arrows 21 and 22. An acquisition of single points in the area of the k-space center is used, for instance, in the PETRA sequence.

Irrespective of which of the two described approaches is used, with a second measured data acquisition the gradient field strength 11 is preferably smaller than the gradient field strength 10 of the first measured data acquisition. A smaller bandwidth of the response signal results herefrom, however, so that in the context of acquiring measured values for the respective response signal, a larger time interval 13 can be used, which typically results in an improvement in the signal-to-noise ratio.

In step S3, the measured values of the second measured data acquisition or spin densities for the individual k-space coordinates determined herefrom are optionally scaled in the inner area 15, in order to avoid an overemphasis of the inner area on account of the improved signal-to-noise ratio there. The scaling factor can be in particular proportional to the root from the ratio of the time interval 12 to the time interval 13 since the signal-to-noise ratio typically scales with the root from the time interval.

In step S4, the measured data or the spin densities of the first and second measured data acquisition determined herefrom are combined, wherein in this regard in particular a resampling can take place in order to pass the data into a Cartesian coordinate system. In step S5, a Fourier transformation can then take place in order to transform the data from the k-space describing the spatial frequencies into the position space.

Figure 2:
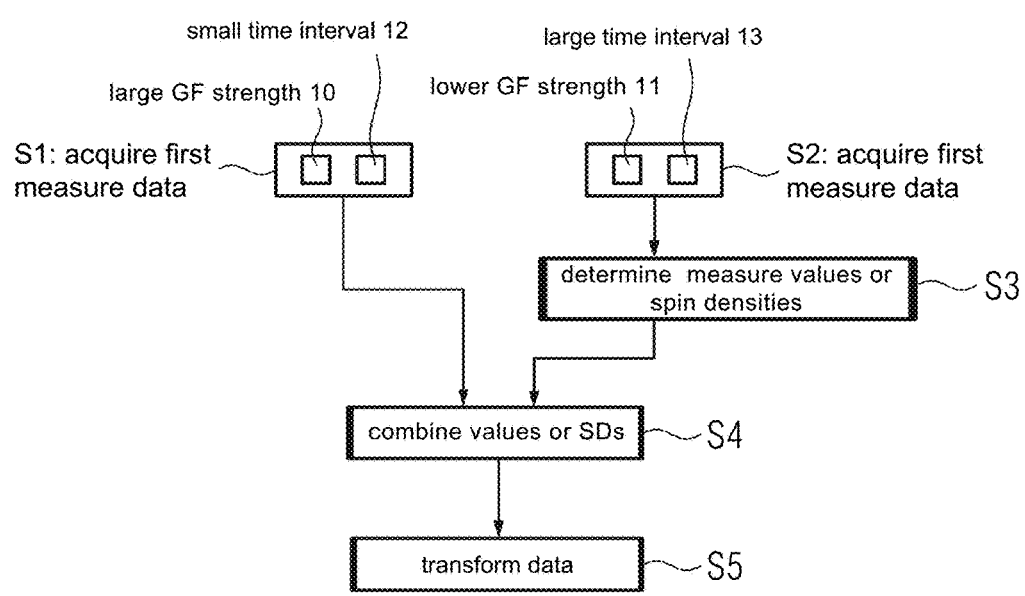
FIG. 2 is a flow chart of an imaging method according to an exemplary embodiment.

In the exemplary embodiment shown in FIG. 2, only two different gradient field strengths 10, 11 and associated time intervals 12, 13 are used. It is also possible for significantly more different gradient field strengths to be used, for instance if a single point scanning is to take place in the inner area 15 of the k-space 14. In this case, a different time interval can be used in each case for each gradient field strength or for at least parts of the gradient field strengths, said time interval being in particular inversely proportional to the respectively used gradient field strength. In particular, the product from used gradient field strength 10, 11 and time interval 12, 13 can therefore be constant. In order to avoid an excessively large length of the measured data acquisition on account of large time intervals, it may be advantageous to carry out this selection of the time intervals 12, 13 only for gradient field strengths which exceed a predetermined limit value. The same time interval can always be used for smaller gradient field strengths, for instance.

Figure 3:
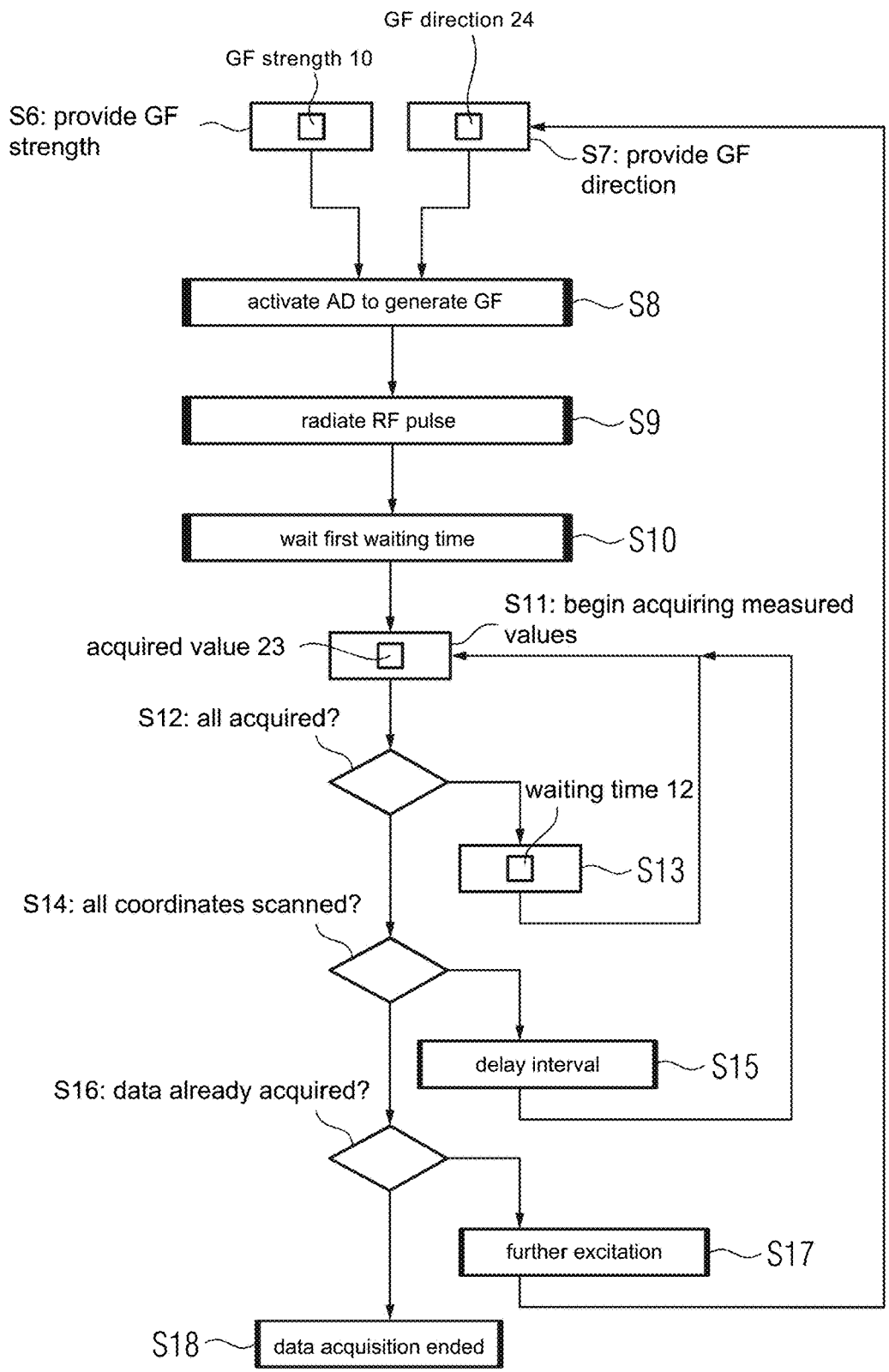
FIG. 3 is a flow chart for carrying out individual measured data acquisitions, according to an exemplary embodiment.

The measured data acquisition carried out in step S1 is shown in detail in FIG. 3. The explained course can also be transferred to the second measured data acquisition in step S2 or further measured data acquisitions. The gradient field strength 10 and gradient field direction 24 to be used are firstly specified here in steps S6 or S7. In step S8, the gradient device 4 is activated by the acquisition device 8 in order to generate a corresponding gradient field. In step S9, the acquisition device 8 activates the radio frequency device 7 in order to radiate a radio frequency pulse into the acquisition volume 2. In this regard a non-selective excitation pulse is typically used in order to excite material in the overall acquisition volume.

In step S10, a first waiting time is initially waited, which can correspond for instance to a dead time of the magnetic resonance device 1 between a transmission and receipt of radio frequency signals. With WASPI or PETRA sequences, the product of the waiting time used in step S10 and the gradient field strength specifies the limit value 18.

In step S11, the acquisition of measured values begins for the first coordinate, which is to be acquired after irradiating the respective radio frequency pulse. After acquiring the measured value 23, a check is carried out in step S12 to determine whether all required measured values were already acquired in order to acquire the response signal for a specific coordinate. In this regard, it can be identified from FIG. 4, for instance, that the coordinate in the k-space will move in the direction of the gradient field even when the response signal is determined; this movement can be negligible, however, since the resulting inaccuracy lies below the resolution of the coordinate scanning.

If it was identified in step S12 that sufficient measured values were not yet acquired, for instance a fixedly predetermined number of measured values was not yet reached, the time interval 12 is waited in step S13 and then step S11 is repeated in order to acquire a further measured value relating to the respective coordinate.

If, on the other hand, it was identified in step S12 that all measured values were already acquired for the respective coordinate, a check is carried out in step S14 to determine whether all coordinates were already scanned for the current gradient field direction 24, in other words whether the edge of the k-space 14 to be scanned was already reached. If this is not the case, a delay interval is optionally waited in step S15 until, on account of the predetermined gradient field strength 10, the next coordinate is reached for which a response signal is to be acquired. The method is then repeated from step S11 in order to determine measured data 23 for a further response signal for a further coordinate.

If, in contrast, it is determined in step S14 that response signals for all coordinates of the k-space to be scanned were already determined for the gradient field direction 24, a check is carried out in step S16 to determine whether measured data 23 was already acquired for all desired gradient field directions 24. If this is not the case, in step S17 a further excitation can be prepared, for instance by switching spoiler gradients, and the method can be continued in step S7 by prespecifying a new gradient field direction 24.

Otherwise, the respective measured data acquisition is concluded in step S18, and the method already explained in respect of FIG. 2 can be continued.

Although the disclosure was illustrated and described in greater detail with the exemplary embodiment, the disclosure is not restricted by the examples disclosed and other variations can be derived therefrom by the person skilled in the art without departing from the protective scope of the disclosure.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein. In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for magnetic resonance imaging by a magnetic resonance (MR) device, wherein k-space describing spatial frequencies in an acquisition volume is scanned, the method comprising:
performing a first measured data acquisition in the acquisition volume with a first gradient field strength of a gradient field, the first measured data acquisition including irradiating at least one radio frequency pulse into the acquisition volume and acquiring, by an acquisition device, a first series of measured values which are spaced apart temporally; and
performing a second measured data acquisition with a second gradient field strength different from the first gradient field strength, the second measured data acquisition including irradiating at least one radio frequency pulse into the acquisition volume and acquiring, by the acquisition device, a second series of measured values which are spaced apart temporally,
wherein with the first measured data acquisition, the first measured values for a respective response signal are acquired at a first time interval from one another and with the second measured data acquisition, the second measured values for a respective response signal are acquired at a second time interval from one another which differs from the first time interval.

2. The method as claimed in claim 1, wherein the first gradient field strength is larger than the second gradient field strength, wherein the first time interval is smaller than the second time interval.

3. The method as claimed in claim 1, wherein the first and the second time intervals are inversely proportional to the first and the second gradient field strengths, respectively.

4. The method as claimed in claim 1, wherein:
the first time interval is inversely proportional to the first gradient field strength; or
the second time interval is inversely proportional to the second gradient field strength.

5. The method as claimed in claim 1, further comprising performing further measured data acquisitions for more than two gradient field strengths which differ from one another, wherein:
the time intervals between the first, second, and further acquisitions of the measured values are selected so that a product of the respective gradient field strength and the time interval for all measured data acquisitions or for all measured data acquisitions, the gradient field strength of which exceeds a predetermined limit value, is constant; and/or
the same time intervals are used for all measured data acquisitions, the gradient field strength of which does not reach a predetermined limit value.

6. The method as claimed in claim 1, wherein:
coordinates of k-space are exclusively scanned by the first measured data acquisition, a distance of which from a center of k-space exceeds a predetermined limit value; and/or
the coordinates of the k-space are scanned exclusively by the second measured data acquisition, the distance of which from the center of the k-space does not reach the predetermined limit value.

7. The method as claimed in claim 1, wherein, reconstruct image data, the first or second measured values determined for a respective coordinate in k-space, or a spin density in k-space determined from the first or second measured values determined for the respective coordinate, are weighted as a function of the first or second time interval, respectively, between acquisitions of the first or second measured values.

8. The method as claimed in claim 1, wherein, with the first and/or second measured data acquisition, the at least one respective radio frequency pulse is irradiated into the acquisition volume after a respective predetermined gradient field is set and/or after irradiating the at least one respective radio frequency pulse at consecutive time intervals, measured values for different coordinates of k-space being acquired in each case.

9. A computer program product embodied on a non-transitory computer-readable storage medium, which includes a program and is directly loadable into a memory of the MR device, when executed by a processor of the MR device, causes the processor to perform the method as claimed in claim 1.

10. A non-transitory computer-readable storage medium with an executable program stored thereon, that when executed, instructs a processor to perform the method of claim 1.

11. A magnetic resonance device, comprising:
- a gradient device configured to generate a gradient field in an acquisition volume,
- a radio frequency device configured to irradiate a radio frequency pulse into the acquisition volume, and
- a controller configured to acquire response signals and to control the gradient device and the radio frequency device to:
  - perform a first measured data acquisition in the acquisition volume with a first gradient field strength of a gradient field, the first measured data acquisition including irradiating at least one radio frequency pulse into the acquisition volume and acquiring, by an acquisition device, a first series of measured values which are spaced apart temporally; and
  - perform a second measured data acquisition with a second gradient field strength different from the first gradient field strength, the second measured data acquisition including irradiating at least one radio frequency pulse into the acquisition volume and acquiring, by the acquisition device, a second series of measured values which are spaced apart temporally,
- wherein with the first measured data acquisition, the first measured values for a respective response signal are acquired at a first time interval from one another and with the second measured data acquisition, the second measured values for a respective response signal are acquired at a second time interval from one another which differs from the first time interval.

* * * * *